US009411919B2

(12) United States Patent
Huang et al.

(10) Patent No.: US 9,411,919 B2
(45) Date of Patent: Aug. 9, 2016

(54) METHOD AND APPARATUS FOR BITCELL MODELING

(71) Applicant: GLOBALFOUNDRIES Singapore Pte. Ltd., Singapore (SG)

(72) Inventors: Zhiqi Huang, Singapore (SG); Yoke Weng Tam, Singapore (SG); Benjamin Lau, Singapore (SG); Bai Yen Nguyen, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/531,451

(22) Filed: Nov. 3, 2014

(65) Prior Publication Data

US 2016/0125114 A1     May 5, 2016

(51) Int. Cl.
*G06F 9/455*     (2006.01)
*G06F 17/50*    (2006.01)

(52) U.S. Cl.
CPC ........ *G06F 17/5045* (2013.01); *G06F 17/5036* (2013.01)

(58) Field of Classification Search
USPC ........................................................ 716/111
See application file for complete search history.

(56) References Cited

U.S. PATENT DOCUMENTS

2013/0047132 A1*  2/2013  Kim ................... G06F 12/0246
                                                   716/132

* cited by examiner

*Primary Examiner* — Eric Lee
(74) *Attorney, Agent, or Firm* — Ditthavong & Steiner, P.C.

(57) ABSTRACT

A methodology for the simulation of semiconductor memory devices that exhibits improved accuracy and speed, and the apparatus performing the methodology are disclosed. Embodiments may include determining a state of a bitcell of an integrated circuit (IC) design, determining a first threshold voltage for the bitcell based on the state of the bitcell, and simulating electrical characteristics of the bitcell according to the first threshold voltage to verify the IC design.

7 Claims, 2 Drawing Sheets

METHOD AND APPARATUS FOR BITCELL MODELING

TECHNICAL FIELD

The present disclosure relates to the simulation of electrical characteristics of semiconductor devices. In particular, the present disclosure relates to the computer simulation of programming and erasing operations for electrically erasable programmable read only memories (EEPROM).

BACKGROUND

Conventional approaches to modeling and simulating bitcell operations rely on electronic circuit simulators such as SPICE models. Top-level simulations of such operations for large bitcell arrays (e.g., EEPROM) include multiple cycles of erase and/or program operations. However, conventional simulation techniques lack the ability to modify the threshold voltage during transition of a bitcell from one state to another. As a result, the logic value of the bitcell cannot be switched between "1" and "0" without generating simulation errors. Specifically, the simulation fails because a verify operation after the erase or program operation reports either a failed or passed status depending on an expected bit value. In addition, conventional bitcell simulators (e.g., SPICE) are slow because of the large number of simulation parameters involved. Due to these disadvantages, top-level simulations of memory arrays cannot complete a complete erase or program cycle accurately and without operator guidance.

A need therefore exists for methodology enabling full-cycle top-level simulation of large programmable bitcell arrays by utilizing transitional bitcell models.

SUMMARY

An aspect of the present disclosure is utilizing a computed value for the threshold voltage of a bitcell after each operation based on simulated electrical characteristics of the bitcell.

Another aspect of the present disclosure is utilizing a modeling language with dynamically programmable simulation parameters.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a state of a bitcell of an integrated circuit (IC) design, determining a first threshold voltage for the bitcell based on the state of the bitcell, and simulating electrical characteristics of the bitcell according to the first threshold voltage to verify the IC design.

Aspects of the present disclosure include the state of the bitcell including an erased, a programmed, or a read state. Additional aspects include the first threshold voltage being determined (based on one or more bias voltages of the bitcell) by the model users, either erased or programmed state. Users can modify bitcell bias condition in the simulation so that the bitcell threshold voltage is changed which means that bitcell state is changed. Further aspects include the first threshold voltage being determined if the one or more bias voltages satisfy one or more corresponding bias threshold values. Additional aspects include the one or more bias voltages of the bitcell corresponding to one or more pin voltages of the bitcell. Further aspects include verifying the state of the bitcell based on an expected bitcell value corresponding to a write or an erase operation. Additional aspects include simulating the electrical characteristics of the bitcell and one or more other bitcells in parallel. Further aspects include causing the simulation to modify the state of the bitcell after the simulation of the electrical characteristics of the bitcell according to the first threshold voltage, determining a second threshold voltage for the bitcell based on the modification of the state of the bitcell, and simulating electrical characteristics of the bitcell according to the second threshold voltage to verify the IC design.

Another aspect of the present disclosure is an apparatus including at least one processor and at least one memory including computer program code for one or more programs, the at least one memory and the computer program code configured to, with the at least one processor, cause the apparatus to perform: determining a state of a bitcell of an IC design, determining a first threshold voltage for the bitcell based on the state of the bitcell, and simulating electrical characteristics of the bitcell according to the first threshold voltage to verify the IC design.

Aspects include the state of the bitcell including an erased, a programmed, or a read state. Additional aspects include the first threshold voltage being determined based on one or more bias voltages of the bitcell. Further aspects include the first threshold voltage being determined if the one or more bias voltages satisfy one or more corresponding bias threshold values. Additional aspects include the one or more bias voltages of the bitcell corresponding to one or more pin voltages of the bitcell. Further aspects include apparatus being configured to verify the state of the bitcell based on an expected bitcell value corresponding to a write or an erase operation. Additional aspects include the apparatus being further configured to simulate the electrical characteristics of the bitcell and one or more other bitcells in parallel. Further aspects include the apparatus being further configured to cause the simulation to modify the state of the bitcell after simulation of the electrical characteristics of the bitcell according to the first threshold voltage, determine a second threshold voltage for the bitcell based on the modification of the state of the bitcell, and simulate electrical characteristics of the bitcell according to the second threshold voltage to verify the IC design.

Another aspect of the present disclosure is a bitcell modeling method, the method including: determining a state of a bitcell of an IC design, determining a first threshold voltage for the bitcell based on one or more bias voltages of the bitcell corresponding to the state of the bitcell, simulating electrical characteristics of the bitcell according to the first threshold voltage to verify the IC design, causing the simulation to modify the state of the bitcell after the simulation of the electrical characteristics of the bitcell according to the first threshold voltage, determining a second threshold voltage for the bitcell based on the modification of the state of the bitcell, and simulating electrical characteristics of the bitcell according to the second threshold voltage to verify the IC design.

Aspects include the state of the bitcell including an erased, a programmed, or a read state. Additional aspects include the first threshold voltage being determined if the one or more bias voltages satisfy one or more corresponding bias threshold values. Further aspects include simulating the electrical characteristics of the bitcell and one or more other bitcells in parallel.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of incomplete or incorrect simulation results attendant upon conventional modeling of programmable memory bitcells. In accordance with embodiments of the present disclosure, a threshold voltage value is dynamically calculated based on a state of the bitcell.

Methodology in accordance with embodiments of the present disclosure includes: determining a state of a bitcell of an IC design, determining a first threshold voltage for the bitcell based on the state of the bitcell, and simulating electrical characteristics of the bitcell according to the first threshold voltage to verify the IC design.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
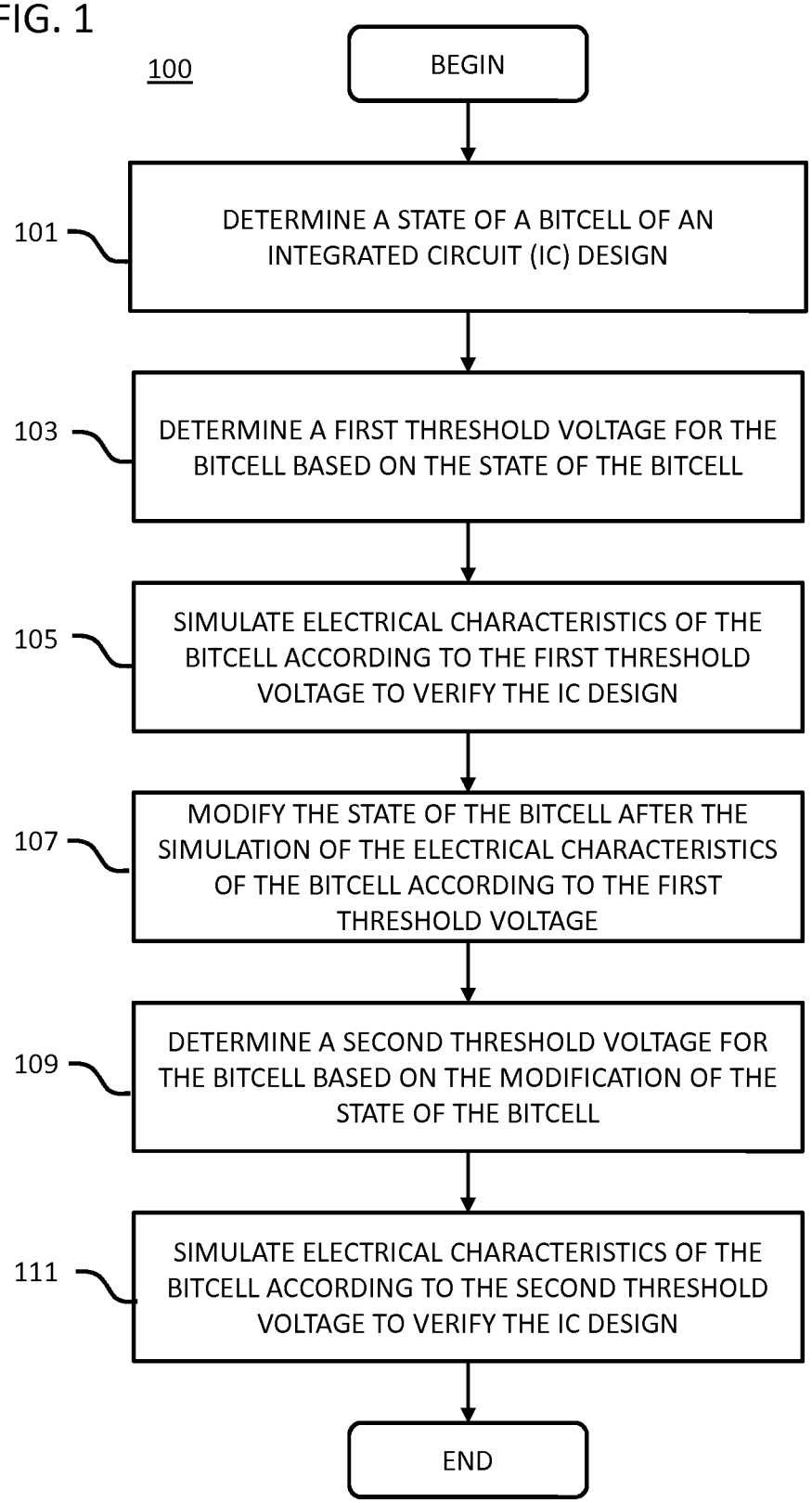
FIG. 1 illustrates a process for a bitcell modeling, in accordance with an exemplary embodiment of the present disclosure.
Figure 2:
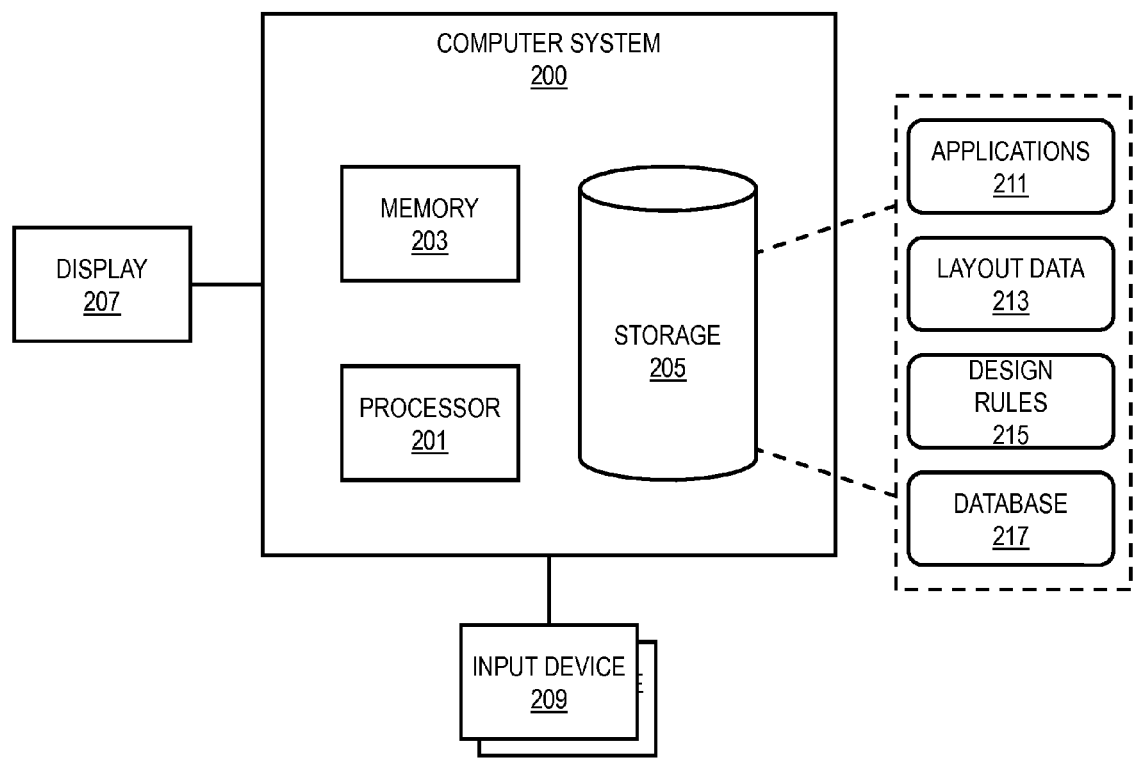
FIG. 2 illustrates a computer system for implementing a bitcell modeling method, in accordance with an exemplary embodiment of the present disclosure.

FIG. 1 illustrates a process 100 for a bitcell modeling, in accordance with an exemplary embodiment of the present disclosure. The process 100 may be implemented in, for instance, a chip set including a processor and a memory as shown in FIG. 2. By way of example, process 100 may be executed in electronic circuit simulation tools such as HSPICE, HSIM or FINESIM with behavior modeling language Verilog-A®.

In step 101, a state of a bitcell of an IC design is pre-defined by users. For example, the state of a bitcell may include an erased or a programmed state. In step 103, a first threshold voltage for the bitcell based on the state of the bitcell is determined. By way of example, the threshold voltage may be determined based on one or more bias voltages of the bitcell. Specifically, for example, the threshold voltage may be determined based on whether the bias voltages of the bitcell satisfy corresponding threshold values. The bias voltages may correspond to various pin voltages of the bitcell. Thus, for instance, the state of a bitcell may be determined by looking at the bias voltages at various pins (e.g., bitline (BL), wordline (WL), control gate (CG), array ground (AG), substrate (SUB), output (OUT)) and determining if they simultaneously satisfy various threshold values.

For instance, if WL>15V, CG>14V, AG<0.1V, and SUB<0.1V, then the bitcell may be determined to be in an erased state by increasing the bitcell threshold voltage within each time step. The threshold voltage may then be set to the minimum of $V_{th}+0.5\times(V(CG)-14)$ and 3.0, where $V_{th}$ is the current value of the threshold voltage after each time step, V(CG) is the voltage at the pin CG. $V_{th}$ may have a value from −3 to 3V corresponding to be programmed or erased state.

If WL>15V, CG<0.1V, BL>11V, and SUB<0.1V, then the bitcell may be determined to be in a programmed state. The threshold voltage may then be set to the maximum of $V_{th}+0.5\times(V(BL)-vp\_start)$ and −3.0, where $V_{th}$ is the current value of the threshold voltage and vp_start defines the voltage level of the bitcell as it is about to be programmed.

If BL>0.1V, CG>0.7V, SUB<0.1V, and WL>2.5, then the bitcell may be determined to be readout by access to the cell source-drain current. The source-drain current ($I_{ds}$) may then be set to the maximum of $(V(CG)-V_{th})\times V(BL, AG)\times 0.5\times 8$ μA and 0, where $V_{th}$ is the current value of the threshold voltage and V(BL, AG) is the voltage across the BL and AG pins.

In step 105, electrical characteristics of the bitcell are simulated according to the first threshold voltage to verify the IC design. The simulation may be performed according to various semiconductor models implemented in electronic circuit or other IC simulation programs. The IC design may be verified based on an expected bitcell value (e.g., "0" or "1") corresponding to a write or erase operation. It is contemplated that the simulation of the electrical characteristics of plural bitcells may be performed in parallel, such as would be required for the top-level simulation of large memory devices (e.g., a 32K×8K EEPROM in 0.13 μm technology).

In step 107, the state of the bitcell is modified after the simulation of the electrical characteristics of the bitcell according to the first threshold voltage. For instance, the state (e.g., erased, programmed, read state) of the bitcell is determined by looking at the bias voltages operating on the bitcell, as described above in relation to step 103. In step 109, a second threshold voltage for the bitcell is determined based on the modification of the state of the bitcell. For instance, the value of the threshold voltage is updated according to the determined state of the bitcell, as described above in relation to step 103. In step 111, the electrical characteristics of the bitcell are simulated according to the second threshold voltage to verify the IC design. For instance, the simulation may be performed according to various semiconductor models implemented in electronic circuit or other IC simulation programs, as described above in relation to step 105.

It is contemplated that the above steps may be repeated continuously without operator intervention or manipulation to produce top-level simulation results for multiple erase-program-verify operation cycles. It is further contemplated that such bitcell modeling may be implemented in the top-level simulation of plural bitcell arrays as may be found in memory devices.

The processes described herein may be implemented via software, hardware, firmware, or a combination thereof. Exemplary hardware (e.g., computing hardware) is schematically illustrated in FIG. 2. As shown, computer system 200 includes at least one processor 201, at least one memory 203, and at least one storage 205. Computer system 200 may be coupled to display 207 and one or more input devices 209, such as a keyboard and a pointing device. Display 207 may be utilized to provide one or more GUI interfaces. Input devices 209 may be utilized by users of computer system 200 to interact with, for instance, the GUI interfaces. Storage 205 may store applications 211, layout data (or information) 213, design rules 215, and at least one shape and/or cell database (or repository) 217. Applications 211 may include instructions (or computer program code) that when executed by processor 201 cause computer system 200 to perform one or more processes, such as one or more of the processes described herein. In exemplary embodiments, applications 211 may include one or more manufacturability analysis and/or yield enhancement tools.

The embodiments of the present disclosure can achieve several technical effects, including rapid and accurate top-level simulation of memory devices. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. An apparatus comprising:
at least one processor; and
at least one memory including computer program code for one or more programs, the at least one memory and the computer program code configured to, with the at least one processor, cause the apparatus to:
determine a state of a bitcell of an integrated circuit (IC) design;
determine a first threshold voltage for the bitcell based on bias voltages of the bitcell corresponding to the state of the bitcell, wherein a determination is simultaneously made as to whether the bias voltages satisfy corresponding threshold values;
simulate electrical characteristics of the bitcell according to the first threshold voltage to verify the IC design;
cause the simulation to modify the state of the bitcell after simulation of the electrical characteristics of the bitcell according to the first threshold voltage;
determine a second threshold voltage for the bitcell based on the modification of the state of the bitcell; and
simulate electrical characteristics of the bitcell according to the second threshold voltage to verify the IC design, wherein:
the bias voltages correspond to pin voltages of the bitcell selected from bitline (BL), wordline (WL), control gate (CG), array ground (AG), and substrate (SUB),
when WL>15V, CG>14V, AG<0.1V, and SUB<0.1V, then the bitcell is determined to be in an erased state,
when WL>15V, CG<0.1V, BL>11V, and SUB<0.1V, then the bitcell is determined to be in a programmed state, and
when BL>0.1V, CG>0.7V, SUB<0.1V, and WL>2.5V, then the bitcell is determined to be readout by access to cell source-drain current.

2. The apparatus of claim 1, wherein the bias voltages of the bitcell correspond to pin voltages of the bitcell.

3. The apparatus of claim 1, wherein the apparatus is configured to verify the state of the bitcell based on an expected bitcell value corresponding to a write or an erase operation.

4. The apparatus of claim 1, wherein the apparatus is further configured to:
simulate the electrical characteristics of the bitcell and one or more other bitcells in parallel.

5. A computer-implemented method comprising:
determining, by a processor, a state of a bitcell of an integrated circuit (IC) design;
determining a first threshold voltage for the bitcell based on bias voltages of the bitcell corresponding to the state of the bitcell, wherein a determination is simultaneously made as to whether the bias voltages satisfy corresponding threshold values;
simulating electrical characteristics of the bitcell according to the first threshold voltage to verify the IC design;
causing the simulation to modify the state of the bitcell after the simulation of the electrical characteristics of the bitcell according to the first threshold voltage;
determining a second threshold voltage for the bitcell based on the modification of the state of the bitcell; and
simulating electrical characteristics of the bitcell according to the second threshold voltage to verify the IC design, wherein:
the bias voltages correspond to pin voltages of the bitcell selected from bitline (BL), wordline (WL), control gate (CG), array ground (AG), and substrate (SUB),
when WL>15V, CG>14V, AG<0.1V, and SUB<0.1V, then the bitcell is determined to be in an erased state,
when WL>15V, CG<0.1V, BL>11V, and SUB<0.1V, then the bitcell is determined to be in a programmed state, and
when BL>0.1V, CG>0.7V, SUB<0.1V, and WL>2.5V, then the bitcell is determined to be readout by access to cell source-drain current.

6. The method of claim 5, wherein the first threshold voltage is determined if the one or more bias voltages satisfy one or more corresponding bias threshold values.

7. The method of claim 5, further comprising:
simulating the electrical characteristics of the bitcell and one or more other bitcells in parallel.

* * * * *